United States Patent [19]

Bottomley et al.

[11] Patent Number: 4,614,195

[45] Date of Patent: Sep. 30, 1986

[54] METHOD FOR REDUCTION OF MOTION ARTIFACTS IN FOURIER TRANSFORM NMR IMAGING TECHNIQUES

[75] Inventors: Paul A. Bottomley, Clifton Park, N.Y.; Gary H. Glover, Waukesha, Wis.

[73] Assignee: General Electric Company, Milwaukee, Wis.

[21] Appl. No.: 683,071

[22] Filed: Dec. 18, 1984

[51] Int. Cl.⁴ .............................................. A61B 5/05
[52] U.S. Cl. ..................................... 128/653; 324/309
[58] Field of Search ......................... 128/653; 324/309

[56] References Cited

U.S. PATENT DOCUMENTS

| 4,431,968 | 2/1984 | Edelstein et al. | 324/309 |
| 4,443,760 | 4/1984 | Edelstein et al. | 324/309 |
| 4,506,223 | 3/1985 | Bottomley et al. | 324/309 |

OTHER PUBLICATIONS

Johnson et al, "Instrumentation of NMR Spin-Warp Imaging", J. Phys. E:Sci. Instrum., vol. 15, No. 1, Jan. 1982.

General Electric brochure, "NMR a Perspective on Imaging", 1982, pp. 1-29.

*Primary Examiner*—Kyle L. Howell
*Assistant Examiner*—Ruth S. Smith
*Attorney, Agent, or Firm*—Alexander M. Gerasimow; Douglas E. Stoner

[57] ABSTRACT

A reduction in motion-induced image artifact, occurring when imaging moving subjects using Fourier transform (FT) NMR techniques, is achieved by recognizing that the greatest contribution to the artifacts is simple geometric motion (such as respiration). The method relies on avoiding the synchrony between the sequence repetition time of an FT pulse sequence, such as spin warp, and the period of the motion. In one preferred embodiment, the different amplitude values of the phase-encoding gradient are selected randomly, rather than sequentially. In another preferred embodiment, gradient amplitude values are selected by alternating high and low values in the temporal implementation of the pulse sequence.

8 Claims, 6 Drawing Figures

METHOD FOR REDUCTION OF MOTION ARTIFACTS IN FOURIER TRANSFORM NMR IMAGING TECHNIQUES

BACKGROUND OF THE INVENTION

This invention relates to nuclear magnetic resonance (NMR) methods. More specifically, this invention relates to a method for minimizing or eliminating artifacts induced by breathing method of a patient undergoing an NMR examination using Fourier transform (FT) NMR techniques.

Acquisition of diagnostically useful images of the upper torso and abdomen utilizing FT NMR techniques is often complicated by motion-induced artifacts, which arise from respiratory movement of thoracic or abdominal regions of a subject during the data acquisition period, which can be quite long. The primary cause of motion is patient breathing. The source of these artifacts has been determined to be motion-induced phase and amplitude errors in the phase-encoding direction when using FT imaging techniques, such as the one commonly referred to as "spin warp". It has been found that the greatest contribution to the artifacts is simple geometric motion, as opposed to movement-induced diamagnetic or paramagnetic field changes, or detuning effects on the radio frequency (RF) coil system.

Numerous approaches have been suggested for minimization of these artifacts. Among the approaches suggested are breath holding, various gating schemes which involve data acquisition during expiration/inspiration, and controlled shallow breathing. However, all of these techniques involve either patient cooperation or increased scan time based on the full breathing cycle. Specific drawbacks associated with the proposed conventional techniques are, for example, that respiratory gating requires additional equipment to generate the gating signals and generally prolongs the actual imaging time. Breath holding and shallow breathing may work well with the volunteers but are difficult or impossible for seriously ill or incapacitated patients who are the most likely subjects for NMR imaging.

It is therefore a principal object of the invention to provide a method of scanning subjects which reduces or eliminates motion-induced artifacts.

SUMMARY OF THE INVENTION

A reduction of artifacts due to periodic motion of a study subject undergoing examination by Fourier transform scanning techniques is achieved by selecting the amplitude values of phase-encoding magnetic field gradient pulses associated with each view of a scan such that in the temporal implementation of the scan sequential amplitude values vary non-monotonically.

In one preferred embodiment, gradient amplitudes are selected pseudorandomly.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
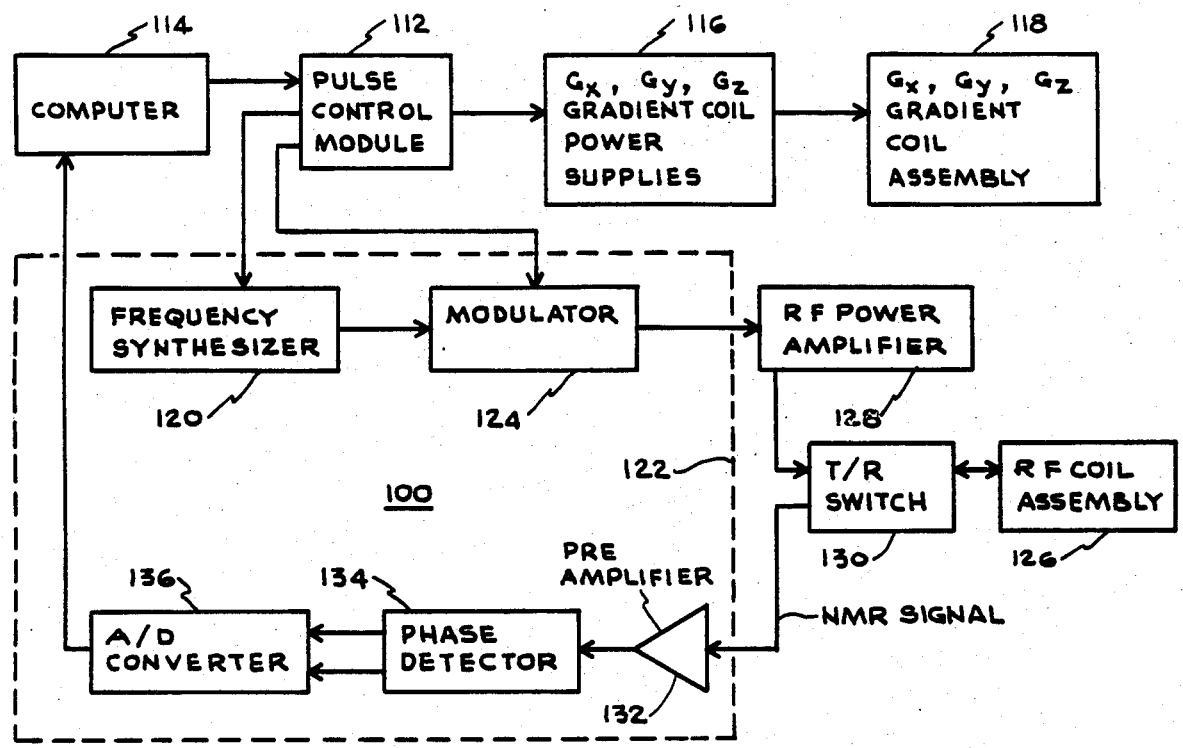
FIG. 1 depicts in block schematic form an exemplary NMR system useful in practicing the invention.

FIG. 1 is a simplified block diagram of an NMR imaging system with respect to which the preferred embodiment of the invention will be disclosed. It will be recognized, however, that the invention as claimed may be advantageously practiced with any suitable apparatus. The system, generally designated 100, includes a pulse control module 112 which provides properly timed pulse waveform signals, under the control of a host computer 114, to magnetic field gradient power supplies collectively designated 116 which energize gradient coils forming part of a gradient coil assembly generally indicated by a block 118. The assembly contains coils which, when energized by the power supplies, produce the $G_x$, $G_y$, and $G_z$ magnetic field gradients directed in the x, y, and z directions, respectively, of the Cartesian coordinate system. The use of the $G_x$, $G_y$, and $G_z$ gradients in NMR imaging applications will be described hereinafter with reference to FIG. 2.

Continuing with reference to FIG. 1, the pulse control module provides activating pulses to an RF synthesizer 120 which is part of an RF transceiver system, portions of which enclosed by dash-line block 122. The pulse control module also supplies modulating signals to a modulator 124 which modulates the output of the RF frequency synthesizer. The modulator RF signals are applied to an RF coil assembly 126 through an RF power amplifier 128 and a transmit/receive switch 130. The RF signals are used to excite nuclear spins in a sample object (not shown) undergoing examination.

The NMR signals from the exicted nuclear spins are picked up by the RF coil assembly and applied through the transmit/receive switch to an RF preamplifier 132 and then to a quadrature phase detector 134. The detected signals are digitized by A/D converter 136 and applied to computer 114 for processing in a well-known manner to, for example, reconstruct NMR images of the sample.

Figure 2:
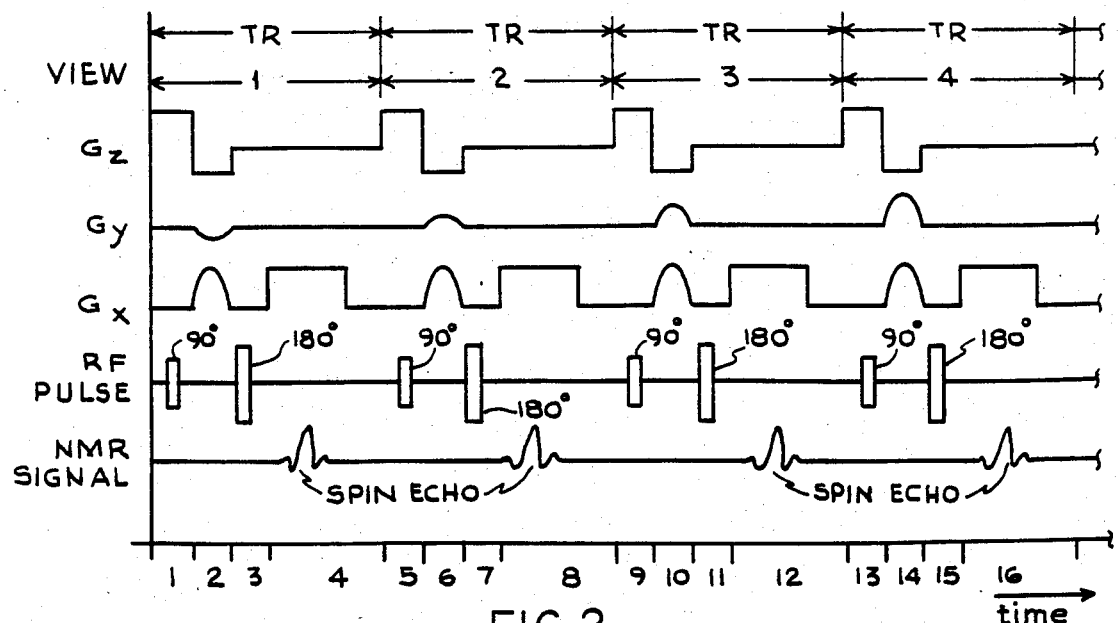
FIG. 2 depicts exemplary views of the one embodiment of a spin-warp imaging pulse sequence useful with the method of the invention.

FIG. 2 depicts four views of what can now be referred to as a convetional imaging pulse sequence of the type known as two-dimensional Fourier transform (2DFT) and which is frequently also referred to as two-dimensional "spin warp." This pulse sequence is useful in obtaining, in a well-known manner, imaging data to reconstruct images of a sample being investigated. The views comprising intervals 1–4, 5–8, 9–12, and 13–16, as indicated along the horizontal axis, are separated by a sequence repetition time TR. A complete pulse sequence (scan) would typically consist of 128, 256, or 512 views which are substantially identical to one another, with the exception that a different amplitude of the phase-encoding magnetic field gradient pulse $G_y$ (inidcated along the vertical axis) is employed in each view (assuming no averaging). As used herein, a scan is defined as a single application of the pulse sequence (for example, that of FIG. 2) in which the number of views is equal to the number of different available phase-encoding gradient amplitudes.

One exemplary view comprising intervals 1–4 will now be described in detail with reference to FIG. 2. In interval 1, a selective 90° RF excitation pulse (typically modulated by a sinc function) is applied in the presence of a positive $G_z$ gradient pulse so as to preferentially excite nuclear spins in a predetermined region of a sample object (not shown) having precession frequencies as predicted by the Larmor equation. A negative $G_z$ pulse is applied in interval 2 to rephase nuclear spins excited in interval 1. Typically, the $G_z$ pulses are selected such that the time integral of the gradient pulse waveform over interval 2 is equal to a negative one half of the time integral of the gradient pulse over interval 1. $G_x$ and $G_y$ gradient pulses are also applied simultaneously with the $G_z$ gradient pulse in interval 2. The function of the $G_y$ gradient pulse is, as alluded to hereinabove, to encode phase information into the excited nuclear spins. The purpose of the $G_x$ gradient pulse is to dephase the excited nuclear spins by a predetermined amount to delay the occurrence of the NMR spin-echo signal in interval 4. The spin echo, produced by the application of a 180° RF pulse in interval 3, is sampled in interval 4 in the presence of a linear $G_x$ readout gradient.

The excitation/sampling process described hereinabove is repeated in subsequent views of the pulse sequence until the $G_y$ gradient is sequenced through its range of amplitudes (e.g., 128, 256, etc.). The NMR information encoded in the NMR signal by the phase encoding and the readout gradient is recovered in a well-known manner using two-dimensional Fourier transform techniques, for the pulse sequence depicted in FIG. 2.

It should be noted the invention could also be practiced with three-dimensional Fourier transform techniques. U.S. Pat. No. 4,431,968, assigned to the same assignee as the present invention and which is incorporated herein by reference, discloses and claims three-dimensional Fourier transform techniques. Briefly, in three-dimensional Fourier transform NMR imaging techniques, phase-encoding gradients are applied in more than one dimension. For these techniques, additional $G_z$ and/or $G_x$ phase-encoding gradient pulses might be added to interval 2 of FIG. 2, for example, and the excitation/sampling process described hereinabove is repeated in subsequent views of the pulse sequence until the $G_y$ and $G_z$ (and/or $G_x$) gradients are all sequenced through their complete range of amplitudes before the spatial image is complete. In accordance with the invention, techniques applicable for ordering the sequence of phase-encoding gradients in both two- and three-dimensional (or, indeed, one-dimensional) Fourier transform techniques are disclosed. Accordingly, although specific reference is made hereinbelow to methods for sequencing $G_y$ in two-dimensional Fourier transform techniques, it is understood tht the same sequencing methods are equivalently applicable to $G_x G_y$ gradient components when applied for phase-encoding purposes in three-dimensional (or one-dimensional) Fourier transform techniques.

Figure 3A:
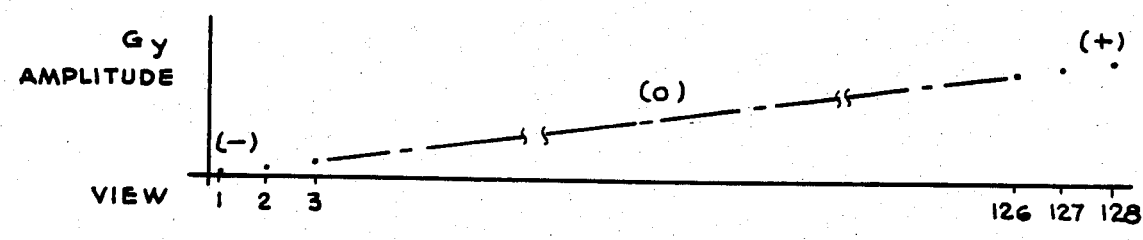
FIG. 3A illustrates a conventional sequence for incrementing the amplitude of the phase-encoding gradient in a pulse sequence such as that shown in FIG. 2.

FIG. 3A depicts a conventional sequence for incrementing the amplitude (indicated along the vertical axis) of the $G_y$ phase-encoding gradient in sequential views (indicated along the horizontal axis) of a two-dimensional spin-warp pulse sequence, such as the one described with reference to FIG. 2. In FIG. 3A, and in FIGS. 3B–3D, each dot represents one $G_y$ gradient amplitude. Typically, in view 1, the $G_y$ gradient is selected to have a predetermined negative amplitude. Subsequently, in views 2–63, the amplitude is increased monotonically through a value of 0 near view 64 and thence increased monotonically to positive amplitude at view 128 (for a pulse sequence having 128 views).

As alluded to hereinabove, it has been found that quasi-periodic motion of the subject due, for example, to respiration, when using the sequence of FIG. 3A, leads to structured aritfacts (ghosts manifested in reconstructed images as discrete ghost images along the phase-encoding direction and loss of resolution). The artifacts are dependent on the relationship between the sequence repetition time TR and the period of the respiratory motion. Specifically, to the extent that the motion is a periodic function of phase-encoding, the artifact will appear as discrete ghost or ghosts. Thus, in accordance with the invention, the amplitudes of the $G_y$ phase-encoding gradient are incremented in a manner that disrupts the relationship between the motion and the phase-encoded frequency.

Figure 3B:
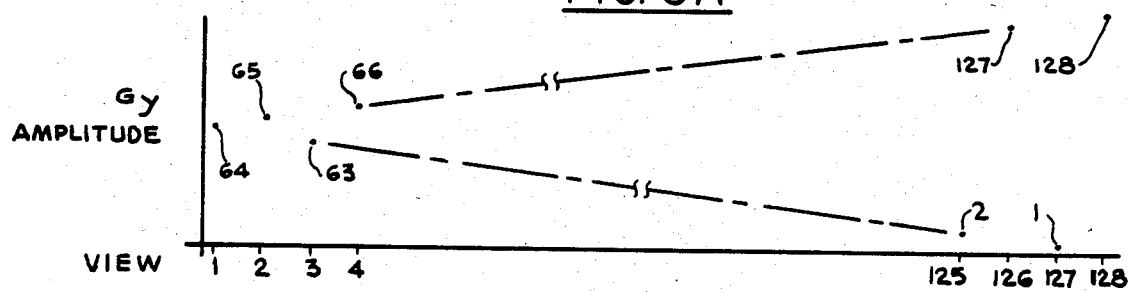
FIGS. 3B–3D are similar to FIG. 3A and illustrate, respectively, in accordance with the invention, lo-hi, alternating lo-hi, and random sequences for incrementing the amplitude of the phase-encoding gradient.

One way of incrementing the $G_y$ gradient amplitude which avoids the conventional incrementing sequence (FIG. 3A) is depicted in FIG. 3B. In FIG. 3B (and in FIGS. 3C and 3D), the reference numbers appearing adjacent to dots denoting phase-encoding gradient amplitudes, designate amplitudes corresponding to those used in like-numbered views in the conventional sequence depicted in FIG. 3A. Thus, the amplitude selected for view 1 in FIG. 3B is that which normally would be associated with view 64 of the conventional amplitude sequence. In view 2, the 65'th conventional amplitude is selected. For views 3 and 4, amplitudes 63 and 66, respectively, are selected. The alternating amplitude selection process is repeated until, for views 127 and 128, conventional amplitudes 1 and 128 are selected. Of course, this sequence could also be implemented in reverse order such that for views 1, 2, 3, etc., in FIG. 3B, conventional amplitudes associated with views 1, 128, 2, 127, etc., in FIG. 3A, repsectively, are selected.

Figure 3C:
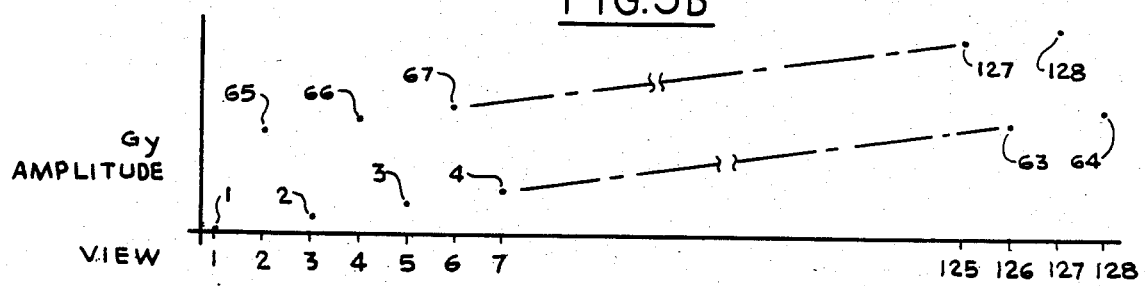

Another amplitude selection sequence which could be utilized in accordance with the invention is illustrated in FIG. 3C. In this case, the pulse sequence is implemented such that for views 1–8, for example, conventional amplitudes 1, 65, 2, 66, 3, 67, 4, and 68, respectively, are selected. As with the sequence of FIG. 3B, the sequence of FIG. 3C could also be implemented in reverse order.

Figure 3D:
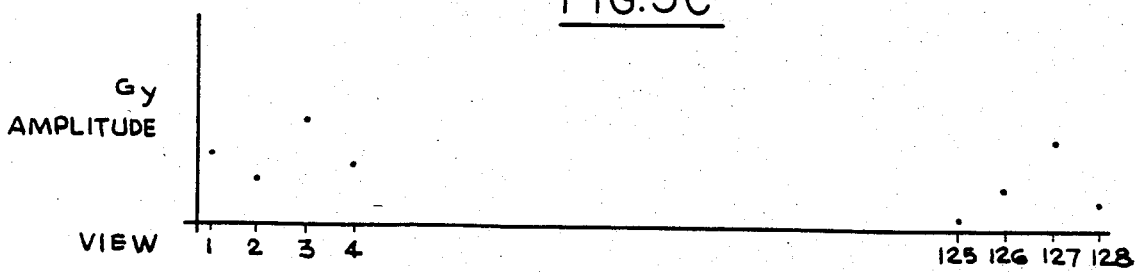

FIG. 3D illustrates yet another possible sequence for selecting phase-encoding gradient amplitudes. As seen in FIG. 3D, instead of sequentially incrementing the amplitude of the phase-encoding gradient (as done in the conventional sequence, FIG. 3A), the different amplitudes of the phase-encoding gradients applied in sequential views of the imaging pulse sequence (FIG. 2) are selected randomly (or pseudorandomly) from the total list of phase-encoding amplitudes necessary to complete the scan. Each phase-encoding gradient amplitude is, of course, used only once, unless signal averaging is used. In this case, the number of desired signal averages determines how many times each amplitude is employed. An additional constraint is that all (128, 256, etc.) of the available amplitudes must be used in the course of a complete scan. As is the case with the sequences of FIGS. 3B and 3C, upon completion of the scan, data must be shuffled back into sequential order of views (based upon amplitude values) prior to performing two-dimensional (or three-dimensional, in the case of three-dimensional imaging) Fourier transformation image reconstruction.

Actual and simulated scan data indicate that the technique of randomly selecting phase-encoding gradient amplitudes is more effective in reduction motion-induced artifacts than the techniques described with reference to FIGS. 3B and 3C. The effect of randomizing the amplitudes in sequential views distributes the original discrete ghost artifacts fairly uniformly in a band in the direction of the phase-encoding gradient.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method of reducing artifacts due to periodic motion of a study object undergoing examination by Fourier transform NMR imaging techniques, which techniques employ, in the course of a scan of said object, a plurality of sequentially implemented views, wherein each view includes the steps of exciting magnetic resonance in said object and observing the resulting NMR signals, each view further includes application of a phase-encoding magnetic field gradient pulse along at least one dimensional axis of said object, said method comprising:

selecting the amplitude value of the phase-encoding magnetic field gradient pulse associated with each view, such that the temporal sequence of amplitude values is non-monotonic and performing a Fourier analysis on the observed NMR signals in sequential monotonic order based on values of the phase-encoding magnetic field gradient.

2. The method of claim 1 wherein said amplitude value associated with each view is selected randomly.

3. The method of claim 2 wherein said step of performing comprises rearranging into sequential monotonic order the observed NMR signals based on values of the phase-encoding magnetic field gradient prior to performing a Fourier analysis of said rearranged NMR signal.

4. The method of claim 1 wherein said amplitude value associated with each view is selected pseudorandomly.

5. The method of claim 4 wherein pseudorandom selection comprises alternately selecting high and low amplitude values of said phase-encoding magnetic field gradient.

6. The method of claim 5 wherein said step of performing comprises rearranging into sequential monotonic order the observed NMR signals based on values of the phase-encoding magnetic field gradient prior to performing a Fourier analysis of said rearranged NMR signal.

7. The method of claim 4 wherein said step of performing comprises rearranging into sequential monotonic order the observed NMR signals based on values of the phase-encoding magnetic field gradient prior to performing a Fourier analysis of said rearranged NMR signal.

8. The method of claim 1 wherein said step of performing comprises rearranging into sequential monotonic order the observed NMR signals based on values of the phase-encoding magnetic field gradient prior to performing a Fourier analysis of said rearranged NMR signals.

* * * * *

UNITED STATES PATENT AND TRADEMARK OFFICE
CERTIFICATE OF CORRECTION

PATENT NO. : 4,614,195

DATED : September 30, 1986

INVENTOR(S) : Paul A. Bottomley and Gary H. Glover

It is certified that error appears in the above-identified patent and that said Letters Patent is hereby corrected as shown below:

Col. 1, line 11, change "method" to --motion--.
Col. 2, line 39, change "modulator" to --modulated--.
Col. 3, line 59, after "$G_y$" insert --and--.

--3. The method of Claim 1 wherein said amplitude value associated with each view is selected pseudorandomly.--

--4. The method of Claim 3 wherein pseudorandom selection comprises alternately selecting high and low amplitude values of said phase-encoding magnetic field gradient.--

--5. The method of Claim 1 wherein said step of performing comprises rearranging into sequential monotonic order the observed NMR signals based on values of the phase-encoding magnetic field gradient prior to performing a Fourier analysis of said rearranged NMR signals.--

Col. 6,
 line 23, change "signal" to --signals--.
Col. 6,
 line 29, change "signal" to --signals--.

Signed and Sealed this

Twenty-first Day of April, 1987

*Attest:*

DONALD J. QUIGG

*Attesting Officer*   *Commissioner of Patents and Trademarks*